(12) United States Patent
Nishioka

(10) Patent No.: US 10,627,256 B2
(45) Date of Patent: Apr. 21, 2020

(54) ROTATION ANGLE DETECTING DEVICE

(71) Applicant: FANUC CORPORATION, Yamanashi (JP)

(72) Inventor: Akira Nishioka, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 19 days.

(21) Appl. No.: 16/136,945

(22) Filed: Sep. 20, 2018

(65) Prior Publication Data

US 2019/0094045 A1    Mar. 28, 2019

(30) Foreign Application Priority Data

Sep. 26, 2017 (JP) ................................. 2017-184877

(51) Int. Cl.
*G01B 7/14* (2006.01)
*G01D 5/14* (2006.01)
(Continued)

(52) U.S. Cl.
CPC ............... *G01D 5/145* (2013.01); *G01B 7/30* (2013.01); *G01D 5/2458* (2013.01);
(Continued)

(58) Field of Classification Search
CPC . G01B 7/30; G01B 7/003; G01B 7/14; G01D 5/145; G01D 5/147; G01D 5/202;
(Continued)

(56) References Cited

U.S. PATENT DOCUMENTS 5,754,042 A * 5/1998 Schroeder ................ G01B 7/30
324/207.21
6,100,682 A * 8/2000 Schroeder ................ G01B 7/30
324/207.21
(Continued)

FOREIGN PATENT DOCUMENTS

CN    102667412 A    9/2012
CN    102954755 A    3/2013
(Continued)

OTHER PUBLICATIONS

Decision to Grant a Patent issued by the Japanese Patent Office in relation to Japanese Application No. 2017-184877 dated Apr. 16, 2019 (3 pages) along with English language translation (2 pages).

*Primary Examiner* — Thang X Le
(74) *Attorney, Agent, or Firm* — Robert P. Michal, Esq.; Carter, DeLuca & Farrell LLP

(57) ABSTRACT

A rotation angle detecting device includes: a rotating part rotating integrally with the rotating shaft and including a detected portion; an A-phase detector detecting change of a physical quantity caused by rotation of the rotating part, inside a first detection field over the detected portion and outputting an A-phase signal; and a B-phase detector detecting change of the physical quantity caused by rotation of the rotating part, inside a second detection field located over the detected portion and outputting a B-phase signal that is out of phase with the A-phase signal. The second detection field is shorter than the first detection field with respect to the direction perpendicular to the rotating direction of the rotating part.

8 Claims, 8 Drawing Sheets

(51) Int. Cl.
*G01D 5/245* (2006.01)
*G01B 7/30* (2006.01)
*G01D 5/244* (2006.01)
*G01R 25/00* (2006.01)
*G01R 33/07* (2006.01)

(52) U.S. Cl.
CPC ....... *G01D 5/24466* (2013.01); *G01R 25/005* (2013.01); *G01R 33/072* (2013.01)

(58) Field of Classification Search
CPC ...... G01D 5/206; G01D 5/225; G01D 5/2208; G01D 5/12; G01D 5/14; G01D 5/16; G01D 5/2457; G01D 5/2013; G01D 5/2046; G01D 7/04; G01R 33/0206; G01R 33/06; G01R 33/063; G01R 33/09; G01R 33/093; G01R 33/0052; G01R 33/18; G01P 1/026; G01P 3/66; G01P 3/68; G01P 3/665; G01P 3/443; G01P 3/488; G01P 3/487; G01P 3/481; G01P 3/685; G01N 27/9033; G01N 27/902; G01N 27/9013; G01N 27/904; G01N 27/223; G01N 27/82; G01N 27/9093
See application file for complete search history.

(56) References Cited

U.S. PATENT DOCUMENTS

| | | | | |
|---|---|---|---|---|
| 9,068,859 | B2 * | 6/2015 | Dwyer | .................. G01D 5/145 |
| 9,297,635 | B2 * | 3/2016 | Tokida | .................... G01B 7/14 |
| 10,408,892 | B2 * | 9/2019 | David | .................... G01R 33/07 |
| 2004/0263160 | A1 | 12/2004 | Nihei et al. | |
| 2009/0315543 | A1 * | 12/2009 | Guo | ....................... G01D 5/145 |
| | | | | 324/207.21 |

FOREIGN PATENT DOCUMENTS

| | | |
|---|---|---|
| CN | 104006833 A | 8/2014 |
| CN | 106706012 A | 5/2017 |
| JP | 11-153451 A | 6/1999 |
| JP | 2001-201364 A | 7/2001 |
| JP | 2004-245794 A | 9/2004 |
| JP | 2007-278831 A | 10/2007 |
| JP | 2012-037357 A | 2/2012 |
| JP | 2015158423 A | 9/2015 |
| JP | 2017003430 A | 1/2017 |
| WO | 2017056575 A1 | 4/2017 |

* cited by examiner

ROTATION ANGLE DETECTING DEVICE

CROSS-REFERENCE TO RELATED APPLICATION

This application is based upon and claims the benefit of priority from Japanese Patent Application No. 2017-184877 filed on Sep. 26, 2017, the contents of which are incorporated herein by reference.

BACKGROUND OF THE INVENTION

Field of the Invention

The present invention relates to a rotation angle detecting device for detecting a rotation angle.

Description of the Related Art

As disclosed in Japanese Laid-Open Patent Publication No. 11-153451, an encoder for detecting the rotational angle of a rotating shaft includes a magnetic rotor provided on a rotating shaft and first and second detectors provided so as to oppose projected teeth formed along the circumferential direction of the rotor. Based on the detection signals from the first and second detectors, the rotation angle of the rotating shaft can be determined.

SUMMARY OF THE INVENTION

However, if foreign material (foreign matter) adheres to or scratches on, the rotor (rotating part), the waveforms of the detection signals of the first and second detectors become different from original waveforms, so that an abnormality occurs in the detection signals. Therefore, it is not possible to obtain the rotation angle accurately. Since the detected rotation angle is used for specific control (for example, motor control and the like), if the waveforms of the detection signals deform, the specific control will be affected.

It is therefore an object of the present invention to provide a rotation angle detecting device which detects adhesion of foreign material to a rotating part and scratches on the rotating part and prevents deterioration in detection accuracy of the rotation angle of the rotating part due to foreign material or scratches on the rotating part.

One aspect of the present invention resides in a rotation angle detecting device for detecting a rotation angle of a rotating shaft, comprising: a rotating part rotating integrally with the rotating shaft and including a detected portion used for detecting the rotation angle; a first detector arranged to oppose the detected portion and configured to detect change of a physical quantity caused by rotation of the rotating part, inside a first detection field over the detected portion and output a first detection signal representing the rotation angle of the rotating part; and a second detector arranged to oppose the detected portion and configured to detect change of the physical quantity caused by rotation of the rotating part, inside a second detection field located over the detected portion at a position different from the first detection field with respect to the rotating direction of the rotating part and output a second detection signal that is out of phase with the first detection signal but represents the rotation angle of the rotating part. In this configuration, the second detection field is shorter than the first detection field with respect to a direction perpendicular to the rotating direction of the rotating part.

According to the present invention, it is possible to obtain a first detection signal whose waveform is deformed by the influence of a foreign material or a scratch on the rotating part and a second detection signal whose waveform is not deformed by the foreign material or scratch on the rotating part. As a result, it is possible to detect a foreign material or scratch on the rotating part and prevent the detection accuracy of the rotation angle of the rotating part from deteriorating due to a foreign material or a scratch on the rotating part.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A rotation angle detecting device according to the present invention will be detailed hereinbelow by describing the preferred embodiment with reference to the accompanying drawings.

Embodiment

Figure 1:
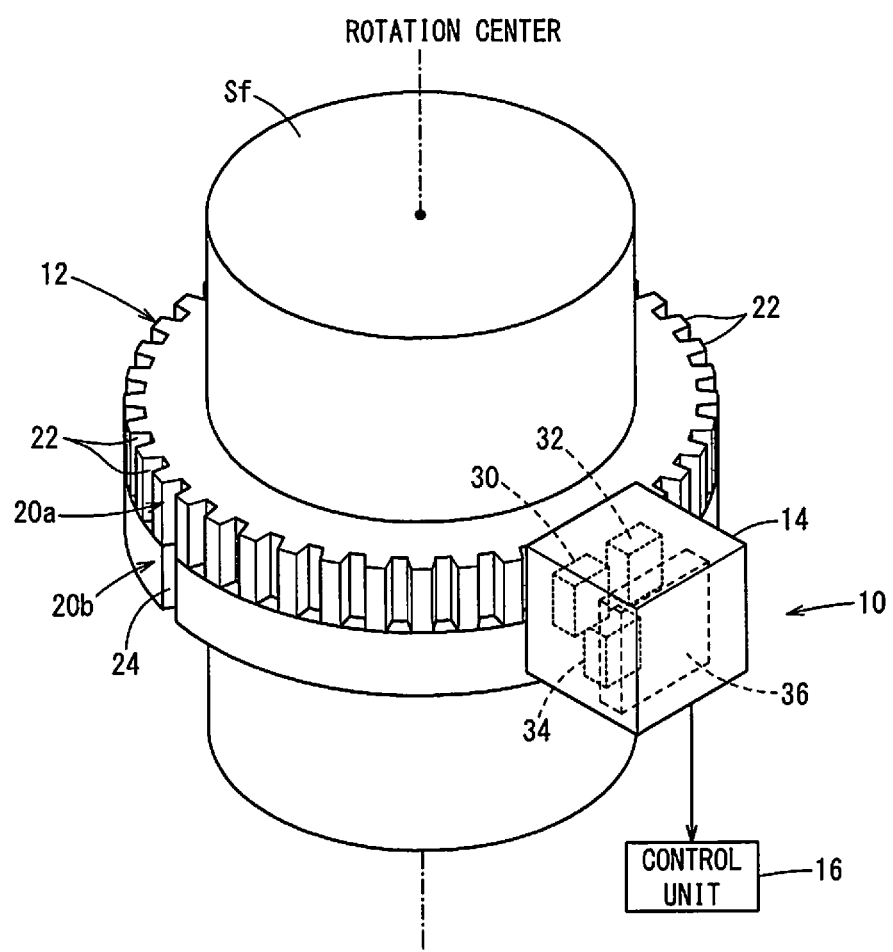
FIG. 1 is a configuration diagram of a rotation angle detecting device in the embodiment.

FIG. 1 is a configuration diagram of a rotation angle detecting device 10. The rotation angle detecting device 10 includes a magnetic rotor 12 that rotates integrally with a rotating shaft Sf, a detection unit 14 that detects and outputs a detection signal corresponding to the rotation angle θ of the rotor 12 and a control unit 16 that performs a predetermined calculation based on the detection signal from the detection unit 14. The rotor 12 is connected to the rotating shaft Sf, concentrically with the rotation center of the rotating shaft Sf. Therefore, the rotation center of the rotor 12 coincides with the rotation center of the rotating shaft Sf.

The rotor 12 includes a detected portion (first detected portion) 20a used to detect a rotation angle θ and a detected portion (second detected portion) 20b used to detect the phase in one revolution of the rotor 12.

The detected portion 20a is provided on the outer circumferential side of the rotor 12. The detected portion 20a has a plurality of teeth 22 projecting radially outward at intervals of a constant pitch P over the entire outer circumferential side of the rotor 12 (see also FIG. 2). In FIG. 1, in order to make the explanation easy to understand, the multiple teeth 22 are illustrated in an exaggerated manner, but they are actually much smaller.

The detected portion 20b is provided on the outer circumferential side of the rotor 12. The detected portion 20b has a slot 24 formed at a position (origin position) on the outer circumferential side of the rotor 12 (see FIG. 5). In FIG. 1, the slot 24 is illustrated in an exaggerated manner for clarity, but it is actually much smaller. The detected portions 20a, 20b are formed so as not to overlap with each other, or in other words, so as to be shifted in the axial direction of the rotor 12 (the direction perpendicular to the rotational direction of the rotor 12).

The detection unit 14 includes an A-phase detector 30, a B-phase detector 32, a Z-phase detector 34 and a magnet 36. The magnet 36 applies a magnetic bias to the A-phase detector 30, the B-phase detector 32 and the Z-phase detector 34. Therefore, the A-phase detector 30, B-phase detector 32 and Z-phase detector 34 are arranged between the rotor 12 and the magnet 36.

The A-phase detector (first detector) 30 is arranged so as to oppose the detected portion 20a. The A-phase detector 30 detects change in the magnetic flux density (physical quantity) due to rotation of the rotor 12 (rotating shaft Sf) in a first detection field DF1 over the detected portion 20a and outputs an A-phase signal (first detection signal) Sa indicating the rotation angle θ of the rotor 12 (the shaft Sf). The A-phase signal Sa, which is a detection signal output from the A-phase detector 30, is supplied to the control unit 16.

Similarly, the B-phase detector (second detector) 32 is arranged to oppose the detected portion 20a. The B-phase detector 32 detects change in the magnetic flux density (physical quantity) due to rotation of the rotor 12 (rotating shaft Sf) in a second detection field DF2 over the detected portion 20a, and outputs a B-phase signal (second detection signal) Sb indicating the rotation angle θ of the rotor 12 (the shaft Sf). The positions of the first detection field DF1 and the second detection field DF2 over the detected portion 20a are shifted with respect to the rotational direction (circumferential direction) of the rotor 12 so that the phase of the B-phase signal Sb is shifted from the phase A signal Sa by 90 degrees. The B-phase signal Sb, which is a detection signal output from the B-phase detector 32, is supplied to the control unit 16.

The Z-phase detector (phase detector) 34 is arranged to oppose the detected portion 20b. The Z-phase detector 34 detects change in the magnetic flux density (physical quantity) due to rotation of the rotor 12 (rotating shaft Sf) in a third detection field DF3 over the detected portion 20b, and outputs a Z-phase signal (phase detection signal) Sz indicating the phase of the rotor 12 (the shaft Sf) in one revolution. The Z-phase signal Sz, which is a detection signal output from the Z-phase detector 34, is supplied to the control unit 16.

Figure 2:
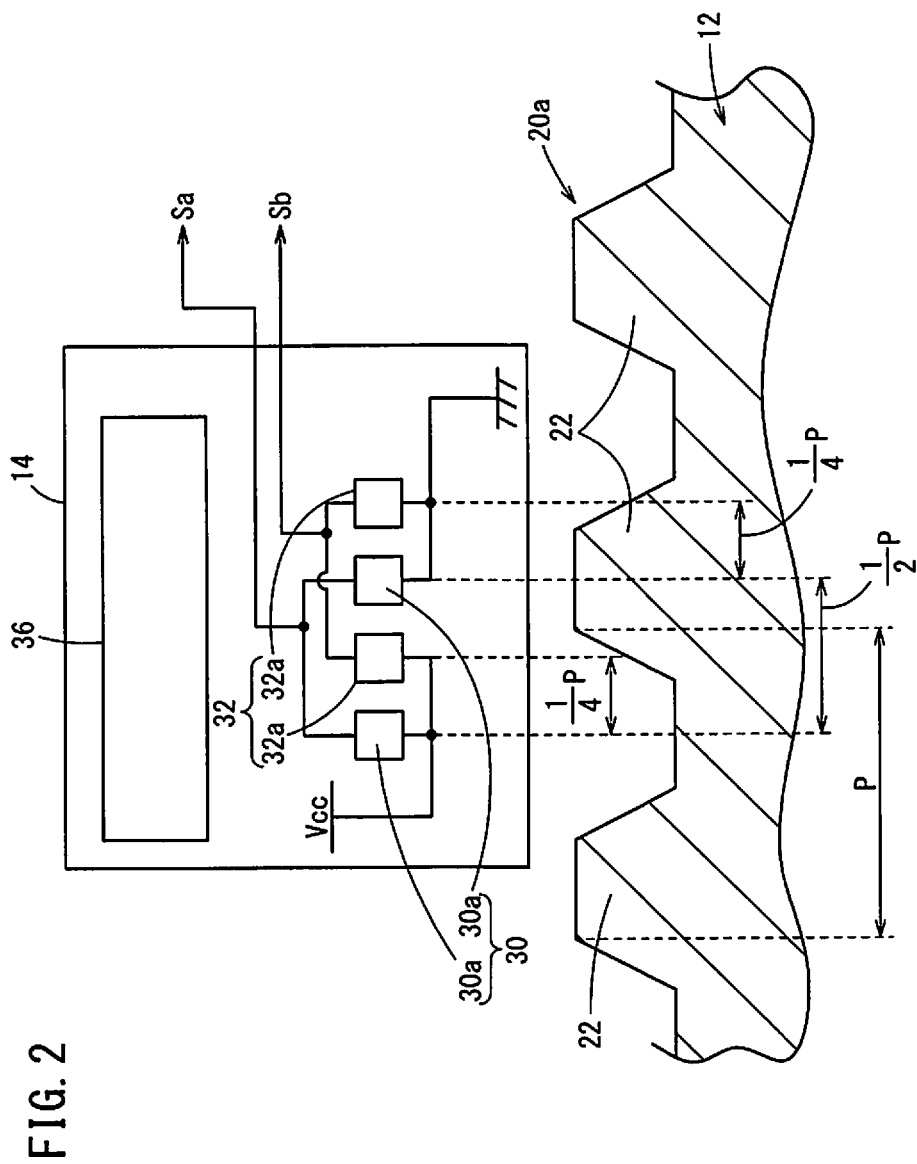
FIG. 2 is a diagram showing a specific configuration of an A-phase detector and a B-phase detector shown in FIG. 1.

Referring next to FIG. 2, specific configurations of the A-phase detector 30 and the B-phase detector 32 will be described in detail. In FIG. 2, for the sake of simplicity, the detected portion 20a of the rotor 12 is shown linearly rather than in a circular shape.

The A-phase detector 30 has two magnetoresistive elements 30a. The two magnetoresistive elements 30a are connected in series between a DC power source Vcc and the ground and arranged so as to oppose the detected portion 20a at intervals of a half of the pitch P along the circumferential direction of the rotor 12. The voltage between the two magnetoresistive elements 30a is output as the A-phase signal Sa. When the rotor 12 rotates, the density of magnetic flux (physical quantity) passing through the two magnetoresistive elements 30a changes so that the A-phase signal Sa changes sinusoidally as shown by the solid line in FIG. 3. Here, the two magnetoresistive elements 30a have the same shape and size.

Similarly, the B-phase detector 32 has two magnetoresistive elements 32a. The two magnetoresistive elements 32a are connected in series between the DC power source Vcc and the ground and arranged so as to oppose the detected portion 20a at intervals of a half of the pitch P along the circumferential direction of the rotor 12. The voltage between the two magnetoresistive elements 32a is output as the B-phase signal Sb. When the rotor 12 rotates, the density magnetic of flux passing through the two magnetoresistive elements 32a changes so that the B-phase signal Sb changes sinusoidally as shown by the broken line in FIG. 3. Here, the two magnetoresistive elements 32a have the same shape and size.

Figure 3:
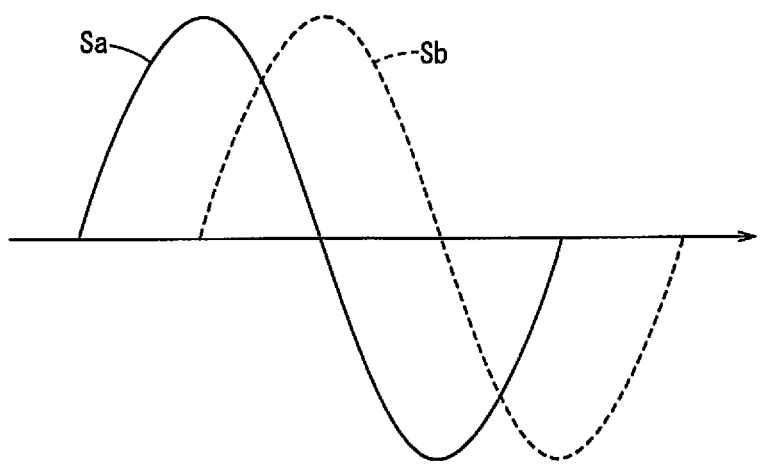
FIG. 3 is a diagram showing waveforms of an A-phase signal and a B-phase signal.

The two magnetoresistive elements 32a are shifted from the two magnetoresistive elements 30a by a quarter of the pitch P in the circumferential direction of the rotor 12. As a result, as shown in FIG. 3, it is possible to shift the A-phase signal Sa and the B-phase signal Sb so as to be 90 degrees out of phase.

Figure 4:
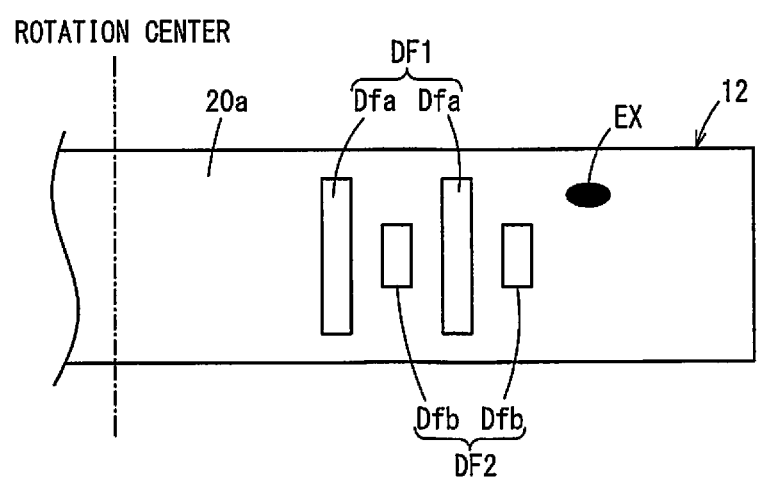
FIG. 4 is a diagram showing detection fields of an A-phase detector and a B-phase detector.

Further, the length of the magnetoresistive element 32a in the axial direction of the rotor 12 (rotating shaft Sf) is shorter than that of the magnetoresistive element 30a. Therefore, as shown in FIG. 4, a detection field Dfb of the magnetoresistive element 32a over the detected portion 20a is shorter than a detection field Dfa of the magnetoresistive element 30a over the detected portion 20a with respect to the direction perpendicular to the rotation direction of the rotor 12. The two detection fields Dfa of the two magnetoresistive elements 30a form the first detection field DF1 of the A-phase detector 30 and the two detection fields Dfb of the two magnetoresistive elements 32a form the second detection fields DF2 of the B-phase detector 32. Here, the detection fields Dfa and Dfb are shifted by a quarter of the pitch P from each other.

The detection field Dfb (second detection field DF2) overlaps the detection field Dfa (first detection field DF1) in the axial direction of the rotor 12 (rotating shaft Sf). That is, the whole detection field Dfb (the second detection field DF2) is covered by the detection field Dfa (the first detection field DF1) with respect to the axial direction of the rotor 12 (rotating shaft Sf). The length of the detected portion 20a in the axial direction of the rotor 12 is equal to or greater than that of the detection field Dfa.

Here, it is preferable to dispose the detection field Dfb (the second detection field DF2) around the center position of the detected portion 20a with respect to the axial direction. The reason is that the foreign material EX tends to adhere to the detected portion 20a at the ends with respect to the axial direction, and the foreign material EX is less likely to adhere to the central area of the detected portion 20a with respect to the axial direction.

When a foreign material EX as shown in FIG. 4 has attached to the rotor 12, more specifically, to the detected portion 20a, the foreign material EX is located within the range of the detection field Dfa (the first detection field DF1) with respect to the axial direction of the rotor 12. Therefore, when the foreign material EX enters the detection field Dfa (the first detection field DF1) as the rotor 12 rotates, the A-phase signal Sa takes a value different from that when the foreign material EX is not attached. That is, due to the adhesion of the foreign material EX, the A-phase signal Sa forms a waveform different from the original waveform (the waveform when the foreign material EX is not attached).

On the other hand, the foreign material EX is located outside the range of the detection field Dfb (the second detection field DF2) with respect to the axial direction of the rotor 12. Therefore, the foreign material EX will not enter the detection field Dfb (the second detection field DF2) when the rotor 12 rotates, so that the waveform of the B-phase signal Sb never changes due to adhesion of the foreign material EX.

In this way, the detection field Dfb (the second detection field DF2 of the B-phase detector 32) of the magnetoresistive element 32a is formed to be shorter in the length in the axial direction of the rotor 12 (the direction perpendicular to the rotating direction of the rotor 12) than the detection field Dfa (the first detection field DF1 of the A-phase detector 30) of the magnetoresistive element 30a. This makes it possible to detect the adhesion of the foreign material EX by the A-phase detector 30 and detect the rotation angle θ of the rotor 12 by the B-phase detector 32 without being affected by the adhesion of the foreign material EX. That is, it is possible to obtain the A-phase signal Sa whose waveform is deformed by the influence of the foreign material EX on the rotor 12 and the B-phase signal Sb whose waveform is not deformed by the foreign material EX on the rotor 12.

Further, use of the A-phase detector 30 and the B-phase detector 32 to obtain the A-phase signal Sa and the B-phase signal Sb makes it possible to confirm that deformation of waveform results from a foreign material EX on the rotor 12. That is, when, of the A-phase signal Sa and the B-phase signal Sb, only the waveform of the A-phase signal Sa deforms, the waveform has been deformed by the foreign material EX.

Here, though adhesion of the foreign material EX to the rotor 12 (specifically, the detected portion 20a) has been described, the same result can be obtained in a case where the rotor 12 is scratched. Hereinafter, a state of the rotor 12 having a foreign material EX adhered to, or a scratch formed on, the rotor 12 (detected portion 20a), is called an abnormal state. Similarly, the detected portion 20a is likely to get scratched in the end portions thereof with respect to the axial direction, and less likely to be scratched around the center the detected portion 20a with respect to the axial direction.

Figure 5:
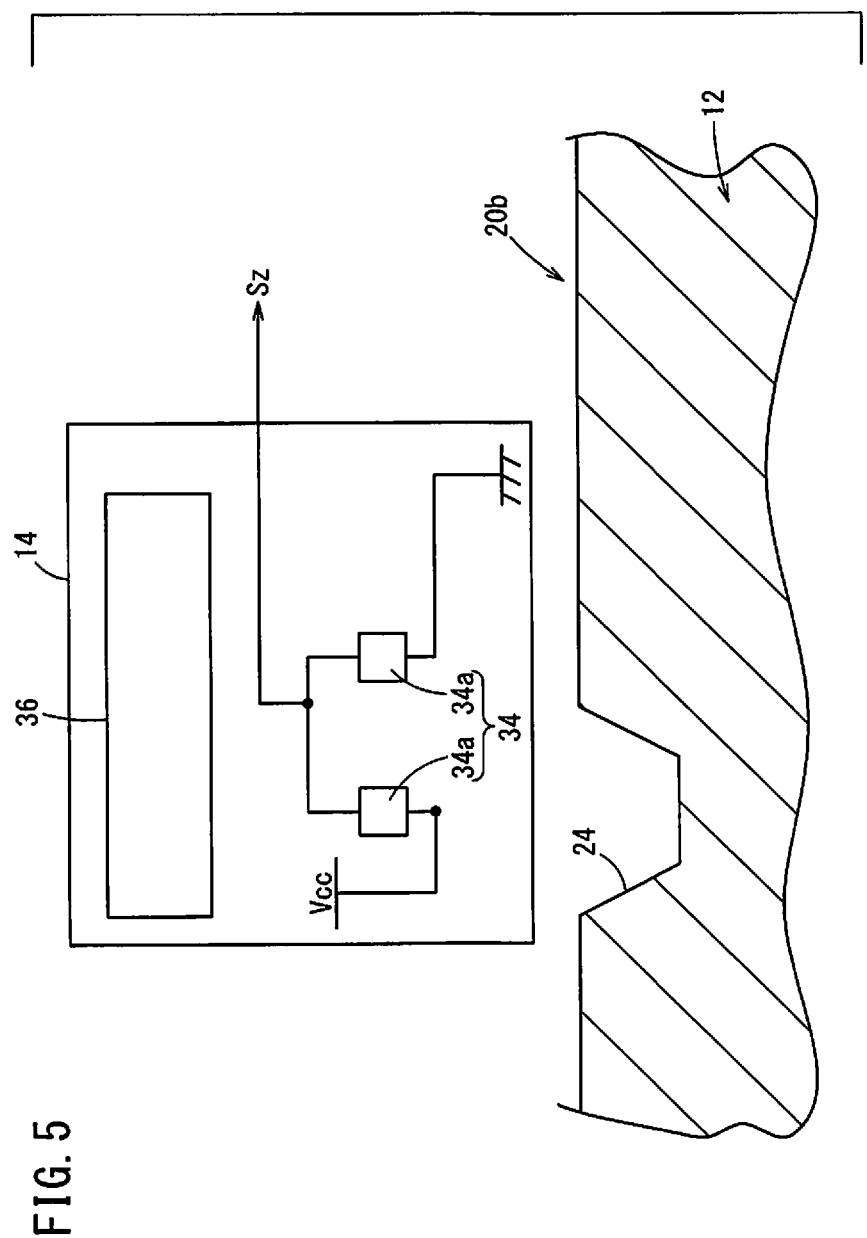
FIG. 5 is a diagram showing a specific configuration of a Z-phase detector shown in FIG. 1.

Next, a specific configuration of the Z-phase detector 34 will be briefly described with reference to FIG. 5. The Z-phase detector 34 has two magnetoresistive elements 34a. The two magnetoresistive elements 34a are connected in series between the DC power source Vcc and the ground and are arranged so as to be a predetermined distance apart from each other with respect to the circumferential direction of the rotor 12 and oppose the detected portion 20b. The voltage between the two magnetoresistive elements 34a is output as the Z-phase signal Sz.

The Z-phase signal Sz is a signal representing the change in the density of magnetic flux passing through the two magnetoresistive elements 34a, caused by rotation of the rotor 12. When the slot 24 formed at one position on the outer circumferential side of the rotor 12 (the origin position of the rotor 12) passes through detection fields Dfc of the magnetoresistive elements 34a over the detected portion 20b, the Z-phase signal Sz produces a distinctive waveform. Therefore, it is possible to detect the phase within one revolution of the rotor 12, based on the Z-phase signal Sz.

The two detection fields Dfc of the two magnetoresistive elements 34a over the detected portion 20b form the third detection field DF3 of the Z-phase detector 34. The two magnetoresistive elements 34a have the same shape and size. Since the third detection field DF3 and the detection fields Dfc are similar to the first detection field DF1 and the detection fields Dfa, illustration of the third detection field DF3 and the detection fields Dfc is omitted.

Figure 6:
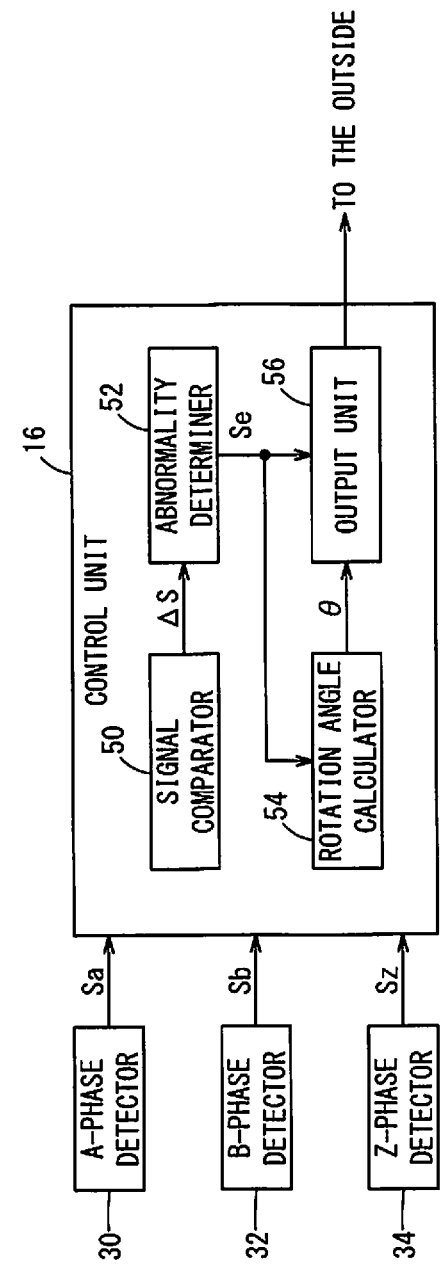
FIG. 6 is a block diagram showing an electrical configuration of the rotation angle detecting device shown in FIG. 1.

FIG. 6 is a configuration block diagram showing an electrical configuration of the rotation angle detecting device 10. The control unit 16 is formed of a computer having a CPU or other processor, a memory and the like. The control unit 16 includes a signal comparator 50, an abnormality determiner 52, a rotation angle calculator 54 and an output part 56.

The signal comparator 50 compares the amplitude of the A-phase signal Sa with the amplitude of the B-phase signal Sb to output the difference ΔS (absolute value). Specifically, the signal comparator 50 has the A-phase signal Sa and the B-phase signal Sb phase synchronized, and outputs the difference ΔS. Since the phase difference between the A-phase signal Sa and the B-phase signal Sb is 90 degrees, the comparator shifts the phase of the A-phase signal Sa or the B-phase signal Sb by 90 degrees so that the phase difference therebetween becomes zero, and calculates the difference ΔS in amplitude between the A-signal Sa and the B-phase signal Sb. The signal comparator 50 outputs the calculated difference ΔS to the abnormality determiner 52.

The abnormality determiner 52 determines whether or not the difference ΔS (absolute value) sent from the signal comparator 50 exceeds a threshold TH. When the difference ΔS exceeds the threshold TH, the abnormality determiner 52 determines that an abnormality has occurred and outputs an abnormality signal Se. The abnormality signal Se is output to the rotation angle calculator 54 and the output part 56. When the rotor 12 is not in the abnormal state (free from foreign material EX or scratch), the A-phase signal Sa and the B-phase signal Sb differ only in phase but have substantially the same waveform. Therefore, when there is no abnormality in the rotor 12, the difference ΔS takes a value equal to or less than the threshold TH, ideally resulting in zero.

In principle, the rotation angle calculator 54 calculates the rotation angle θ of the rotor 12 (rotating shaft Sf) based on the A-phase signal Sa, the B-phase signal Sb and the Z-phase signal Sz. The rotation angle calculator 54 calculates the rotation angle θ from the origin position of the rotor 12. The rotation amount (rotation angle) of the rotor 12 can be obtained from the A-phase signal Sa or the B-phase signal Sb, and the rotational direction of the rotor 12 can be obtained from the A-phase signal Sa and the B-phase signal Sb. The origin position of the rotor 12 can be obtained from the Z-phase signal Sz. Therefore, from the A-phase signal Sa, the B-phase signal Sb and the Z-phase signal Sz, the rotation angle θ from the origin position of the rotor 12 can be obtained. The rotation angle calculator 54 outputs the calculated rotation angle θ to the output part 56.

When the abnormality signal Se is sent from the abnormality determiner 52, the rotation angle calculator 54 calculates the rotation angle θ of the rotor 12 (rotating shaft Sf) without using the A-phase signal Sa. That is, when the rotor 12 is in an abnormal state, the rotation angle calculator 54 calculates the rotation angle θ of the rotor 12, based on the B-phase signal Sb and the Z-phase signal Sz. When the rotor 12 is in an abnormal state, since the A-phase signal Sa is not used, the direction of rotation of the rotor 12 is unknown. However, this can be compensated by using the rotational direction previously obtained. In this way, when the rotor 12 is in an abnormal state, the rotation angle θ of the rotor 12 is calculated without using the A-phase signal Sa of the A-phase detector 30 which is output when a foreign material EX or scratch is detected, so that it is possible to accurately calculate the rotation angle θ of the rotor 12.

The output part 56 outputs the rotation angle θ of the rotor 12 (rotating shaft Sf) calculated by the rotation angle calculator 54 to the outside (e.g., a control device). The external control device performs a predetermined first control process (for example, a feedback control process of a motor that rotates the rotating shaft Sf, etc.) based on the received rotation angle θ.

Further, the output part 56 outputs the abnormality signal Se sent from the abnormality determiner 52 to the outside (for example, a control device). When the abnormality signal Se is sent, the external control device performs a predetermined second control process (for example, a control process for notifying that the rotor 12 is in an abnormal state, etc.). Thereby, the operator can recognize that there is a foreign material EX or a scratch on the rotor 12 (detected portion 20*a*), and hence perform maintenance such as removal of the foreign material EX and replacement of the rotor 12 at an early stage. Thus, it is possible to prevent failure of the rotation angle detecting device 10.

Figure 7:
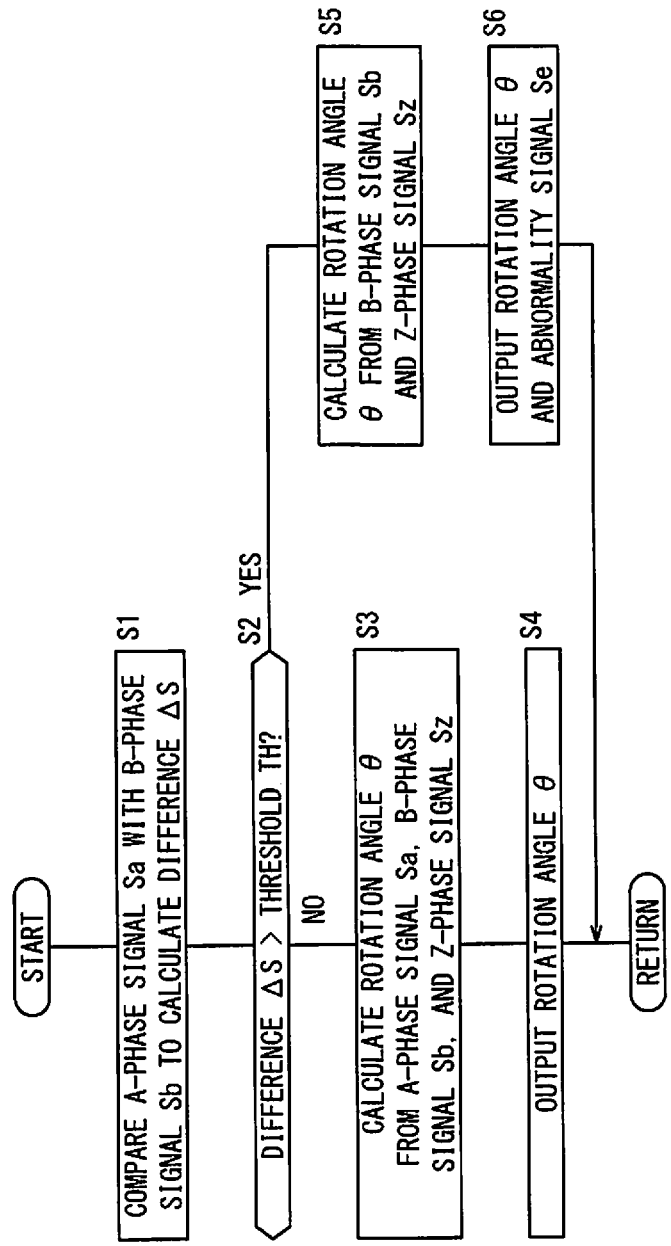
FIG. 7 is a flowchart showing the operation of the rotation angle detecting device shown in FIG. 6.

Next, the operation of the rotation angle detecting device 10 will be described with reference to the flowchart shown in FIG. 7.

At step S1, the signal comparator 50 compares the A-phase signal Sa output from the A-phase detector 30 with the B-phase signal Sb output from the B-phase detector 32 and calculates the difference ΔS.

Then, at step S2 the abnormality determiner 52 determines whether or not the difference ΔS calculated at step S1 is greater than the threshold TH. When the difference ΔS is determined to be equal to or less than the threshold TH at step S2, the abnormality determiner 52 determines that the rotor 12 is in the normal state, and the control proceeds to step S3. On the other hand, if it is determined at step S2 that the difference ΔS exceeds the threshold TH, the abnormality determiner 52 determines that the rotor 12 is in an abnormal state, and the control proceeds to step S5. When the difference ΔS is determined to exceed the threshold TH, the abnormality determiner 52 outputs the abnormality signal Se.

When the control branches to NO at step S2 and goes to step S3, the rotation angle calculator 54 calculates the rotation angle θ of the rotor 12 (rotating shaft Sf), from the A-phase signal Sa output from the A-phase detector 30, the B-phase signal Sb output from the B-phase detector 32 and the Z-phase signal Sz output from the Z-phase detector 34.

Next, at step S4 the output part 56 outputs the rotation angle θ calculated at step S3 to the outside, and the control returns to step S1.

On the other hand, when the control branches to YES at step S2 and proceeds to step S5, the rotation angle calculator 54 calculates the rotation angle θ of the rotor 12 without using the A-phase signal Sa output from the A-phase detector 30. That is, the rotation angle calculator 54 calculates the rotation angle θ of the rotor 12 (rotating shaft Sf) using the B-phase signal Sb output from the B-phase detector 32 and the Z-phase signal Sz output from the Z-phase detector 34.

Next, at step S6 the output part 56 outputs the rotation angle θ and the abnormality signal Se calculated at step S5 to the outside, and the control returns to step S1.

VARIATIONAL EXAMPLES

The above-described embodiment can also be modified as follows.

Variational Example 1

In the above embodiment, when a foreign material EX is located within the range of the detection field Dfb (the second detection field DF2) with respect to the axial direction of the rotor 12, the foreign material EX etc. is undesirably detected by the A-phase detector 30 and the B-phase detector 32. Therefore, the waveforms of the A-phase signal Sa and the B-phase signal Sb are both affected by the foreign material EX etc., and deformed.

To deal with this, in Variational Example 1, a plurality of B-phase detectors 32 are provided, and each of second detection fields DF2 of the multiple B-phase detectors 32 is shifted from the others so as not to overlap one another with respect to the axial direction of the rotating shaft Sf. In this case, the second detection fields DF2 of the multiple B-phase detectors 32 are defined at the same position with respect to the circumferential direction of the rotating shaft (Sf).

Figure 8:
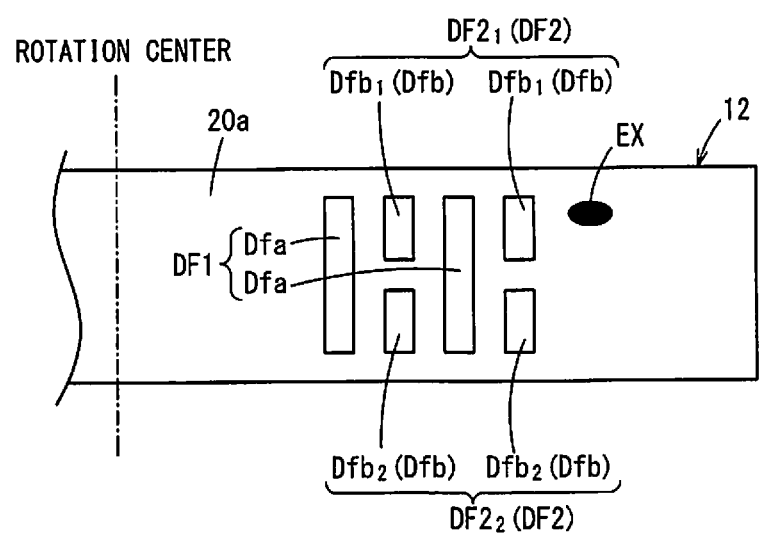
FIG. 8 is a diagram showing detection fields of an A-phase detector and a B-phase detector in Variational Example 1.

FIG. 8 is a diagram showing detection fields of an A-phase detector 30 and B-phase detectors 32 in Variational Example 1. In the following description, for ease of understanding, two B-phase detectors 32 are provided. In a similar manner to the above embodiment, the length of each detection field Dfb (second detection field DF2) of the two B-phase detectors 32 in the axial direction of the rotating shaft Sf (rotor 12) is assumed to be shorter than the length of the detection field Dfa (the first detection field DF1) of the A-phase detector 30 in the axial direction of the rotating shaft Sf. In this Variational Example 1, the second detection fields DF2 (detection fields Dfb) of the two B-phase detectors 32 have the same shape and size.

In order to distinguish the two B-phase detectors 32 from each other, one B-phase detector 32 may be referred to as $32_1$ and the other B-phase detector 32 as $32_2$. Further, the second detection field DF2, detection field Dfb and B-phase signal Sb of one B-phase detector $32_1$ may be referred to as $DF2_1$, $Dfb_1$ and $Sb_1$, whereas the second detection field DF2, detection field Dfb and B-phase signal Sb of the other B-phase detector $32_2$ may be referred to as $DF2_2$, $Dfb_2$ and $Sb_2$ in some cases.

As shown in FIG. 8, the second detection fields $DF2_1$, $DF2_2$ (detection fields $Dfb_1$, $Dfb_2$) are arranged so as not to overlap with each other with respect to the axial direction of the rotating shaft Sf. Therefore, even when a foreign material EX or the like is attached to the rotor 12 (specifically, the detected portion 20*a*), either one of the B-phase detectors 32 can detect the original waveform, without being is affected by the foreign material EX.

For example, when a foreign material EX as shown in FIG. 8 is attached to the rotor 12, the B-phase detector $32_1$ outputs the B-phase signal $Sb_1$ having the waveform affected by the foreign material EX while the B-phase detector $32_2$ outputs the B-phase signal $Sb_2$ having the original waveform not affected by the foreign material EX.

The signal comparator 50 compares the amplitude of the A-phase signal Sa with the amplitude of the B-phase signal $Sb_1$ to calculate a difference ΔS ($ΔS_1$), and also compares the amplitude of the A-phase signal Sa with the amplitude of the B-phase signal $Sb_2$ to calculate a difference ΔS ($ΔS_2$). Both the differences $ΔS_1$ and $ΔS_2$ are absolute values. The signal comparator 50 outputs the calculated differences $ΔS_1$ and $ΔS_2$ to the abnormality determiner 52. In the case where the rotor 12 is not in an abnormal state (in which there is a foreign object EX or scratch on the rotor 12), the differences $ΔS_1$ and $ΔS_2$ are substantially the same.

The abnormality determiner 52 determines whether one of the two differences $\Delta S_1$, $\Delta S_2$ exceeds a threshold TH. If one of them exceeds the threshold TH, the abnormality determiner 52 determines that there is an abnormality, and outputs an abnormality signal Se to the rotation angle calculator 54 and the output part 56. At this time, the abnormality determiner 52 also outputs to the rotation angle calculator 54, information on the B-phase signal Sb, of the B-phase signals $Sb_1$ and $Sb_2$, which is the source of the difference $\Delta S$ not exceeding the threshold TH. Since the waveform of the B-phase signal Sb of the B-phase detector 32 which has detected the foreign object EX or the scratch behaves in the same manner as that of the A-phase signal Sa, the amplitude difference $\Delta S$ between the B-phase signal Sb of the B-phase detector 32 having detected the foreign material EX or the scratch and the A-phase signal Sa falls in a range equal to or less than the threshold TH.

When receiving the abnormality signal Se from the abnormality determiner 52, the rotation angle calculator 54 calculates the rotation angle θ of the rotor 12 (rotating shaft Sf) without use of the A-phase signal Sa and the B-phase signal Sb that is the source of the difference $\Delta S$ not exceeding the threshold TH. In other words, the rotation angle θ of the rotor 12 is calculated based on the B-phase signal Sb, of the B-phase signals $Sb_1$ and $Sb_2$, which has not been affected by the foreign material EX or the like and the Z-phase signal Sz. The calculated rotation angle θ is output to the output part 56.

In this way, it is possible to obtain the original B-phase signal Sb which is not affected by the foreign material EX or the like no matter where a foreign material EX or scratch is on the rotor 12 (more specifically, the detected portion 20a). Therefore, it is possible to accurately calculate the rotation angle θ of the rotor 12 (rotating shaft Sf).

The second detection fields DF2 of the multiple B-phase detectors 32 may have a different length with respect to the axial direction of the rotating shaft Sf, from one another. Further, the positions of the second detection fields DF2 of the multiple B-phase detectors 32 may be shifted from one another with respect to the circumferential direction of the rotating shaft Sf.

Variational Example 2

In the above Variational Example 1, a plurality of B-phase detectors 32 having the second detection field DF2 shorter than the first detection field DF1 of the A-phase detector 30 with respect to the axial direction of the rotating shaft Sf (the rotor 12) are provided. The rotation angle detecting device 10 of the second variational example includes a B-phase detector 32 with a second detection field DF2 of the same length as the first detection field DF1 with respect to the axial direction of the rotating shaft Sf (rotor 12) and one or more B-phase detectors 32 with a second detection field DF2 shorter than the first detection field DF1.

In the second variational example, when the rotor 12 is not in an abnormal state (when there is no foreign object EX or the like), the rotation angle calculator 54 calculates the rotation angle θ, based on the A-phase signal Sa of the A-phase detector 30 and the B-phase signal Sb of the B-phase detector 32 having the second detection field DF2 of the same length as the first detection field DF1. Then, when the rotor 12 is in an abnormal state (when there exists a foreign object EX or the like), the rotation angle calculator 54 calculates the rotation angle θ, without using the A-phase signal Sa of the A-phase detector 30 and the B-phase signal Sb of the B-phase detector 32 having the second detection field DF2 of the same length as the first detection field DF1. That is, the rotation angle θ is calculated based on the B-phase signal or signals Sb of one or more B-phase detectors 32 having the second detection field DF2 shorter than the first detection field DF1.

Variational Example 3

In the third variational example, the abnormality determiner 52 may determine that an abnormality has occurred and outputs the abnormality signal Se when a predetermined number of events that the difference $\Delta S$ exceeds the threshold TH at the same phase in one revolution of the rotor 12 have been observed. That is, when the repeated number of times the difference $\Delta S$ exceeds the threshold TH at the same phase (timing) in one revolution of the rotor 12 reaches the predetermined number, the abnormality determiner 52 determines that an abnormality has taken place. This can prevent erroneous decision of abnormality. In Variational Example 3, the abnormality determiner 52 also uses the Z-phase signal Sz of the Z-phase detector 34 to grasp the phase in one rotation of the rotor 12 when the difference $\Delta S$ exceeds the threshold TH. The predetermined number of times is set at two or greater.

Variational Example 4

In the above embodiment, the rotation angle detecting device 10 including the Z-phase detector 34 has been exemplified, but the rotation angle detecting device 10 without any Z-phase detector 34 may also be used. This is because, for example, in a rotation angle detecting device 10 having an absolute encoder or the like, the rotation angle θ from the origin position of the rotor 12 (rotating shaft Sf) can be obtained without the Z-phase detector 34. In this case, the detected portion 20b is also unnecessary.

Variational Example 5

Though in the above embodiment, the A-phase detector 30, the B-phase detector 32 and the Z-phase detector 34 detect the rotation angle θ of the rotor 12 by magnetism, the rotation angle θ of the rotor 12 may be detected by optical techniques. In other words, the A-phase detector 30, the B-phase detector 32 and the Z-phase detector 34 may be any detectors as long as they detect change in physical quantity caused by rotation of the rotor 12. Therefore, the A-phase detector 30, the B-phase detector 32 and the Z-phase detector 34 may use light receiving elements that detect light, instead of the magnetoresistive elements 30a, 32a, 34a. Further, in the above-described embodiment, the magnetoresistive elements 30a, 32a, 34a are used as one type of magnetic sensor, but other magnetic sensors (coils, magnetic impedance elements, Hall elements, etc.) may be used.

Variational Example 6

In the above embodiment, the first detection field DF1 and the second detection field DF2 are on the outer circumferential side of the rotor 12. However, they may be on an end face of the rotor 12.

Variational Example 7

In the above embodiment, the second detection field DF2 (detection field Dfb) of the B-phase detector 32 is formed to be shorter than the first detection field DF1 (detection field Dfa) of the A-phase detector 30 with respect to the axial direction of the rotating shaft Sf (rotor 12), but the first detection field DF1 (detection field Dfa) of the A-phase detector 30 may be formed to be shorter than the second detection field DF2 (detection field Dfb) of the B-phase detector 32. In other words, the detector having a longer detection field with respect to the axial direction of the rotating shaft Sf (rotor 12) functions as the first detector, and the detector having a shorter detection field plays a role of the second detector.

Variational Example 8

The above variational examples 1 to 7 may be arbitrarily combined to provide another mode.
[Technical Ideas Obtained from Embodiment]
Technical ideas that can be grasped from the above embodiment and Variational Examples 1 to 8 are described below.

A rotation angle detecting device (10) detects a rotation angle (θ) of a rotating shaft (Sf). The rotation angle detecting device (10) includes: a rotating part (12) rotating integrally with the rotating shaft (Sf) and including a detected portion (20a) used for detecting the rotation angle (θ); a first detector (30) arranged to oppose the detected portion (20a) and configured to detect change of a physical quantity caused by rotation of the rotating part (12), inside a first detection field (DF1) over the detected portion (20a) and output a first detection signal (Sa) representing the rotation angle (θ) of the rotating part (12); and a second detector (32) arranged to oppose the detected portion (20a) and configured to detect change of the physical quantity caused by rotation of the rotating part (12), inside a second detection field (DF2) located over the detected portion (20a) at a position different from the first detection field (DF1) with respect to the rotating direction of the rotating part (12) and output a second detection signal (Sb) that is out of phase with the first detection signal (Sa) but represents the rotation angle (θ) of the rotating part (12). The second detection field (DF2) is shorter than the first detection field (DF1) with respect to the direction perpendicular to the rotating direction of the rotating part (12).

With this configuration, the first detector (30) can obtain the first detection signal (Sa) whose waveform is deformed by a foreign material (EX) or scratch on the rotating part (12) while the second detector (32) can obtain the second detection signal (Sb) whose waveform is not deformed due to the foreign object (EX) or scratch on the rotating part (12). As a result, it is possible to detect foreign material (EX) or scratch on the rotating part (12) and prevent degradation in detection accuracy in detecting the rotation angle (θ) of the rotating part (12) due to the foreign material (EX) or scratch on the rotating part (12).

The second detection field (DF2) may overlap the first detection field (DF1) with respect to the direction perpendicular to the rotating direction of the rotating part (12). This configuration enables the first detector (30) to obtain the first detection signal (Sa) whose waveform is deformed by a foreign material (EX) or scratch on the rotating part (12) and the second detector (32) to obtain the second detection signal (Sb) whose waveform is not deformed due to the foreign object (EX) or scratch on the rotating part (12).

The second detection field (DF2) may be located in the center of the detected portion (20a) with respect to the direction perpendicular to the rotating direction of the rotating part (12). This makes it possible to prevent the waveform of the second detection signal (Sb) of the second detector (32) from being deformed due to the influence of the foreign material (EX) or scratch on the rotating part (12).

The rotation angle detecting device (10) may include a plurality of the second detectors (32). The second detection fields (DF2) of the plurality of second detectors (32) may be shifted so as not to overlap with one another with respect to the direction perpendicular to the rotating direction of the rotating part (12). Thereby, it is possible to obtain the second detection signal (Sb) whose waveform will not be deformed due to the influence of a foreign material (EX) or scratch on the rotating part (12) no matter where the foreign material EX or scratch is on the rotating part (12). As a result, it is possible to prevent degradation in detection accuracy (calculation accuracy) of the rotation angle (θ) of the rotating part (12) due to the foreign material (EX) or scratch on the rotating part (12).

The rotation angle detecting device (10) may further include: a signal comparator (50) configured to compare the amplitude of the first detection signal (Sa) with that of the second detection signal (Sb) and output a difference (ΔS) therebetween; and an abnormality determiner (52) configured to determine that an abnormality has occurred when the difference (ΔS) exceeds a threshold (TH) and output an abnormality signal (Se). Thereby, it is possible to determine whether an abnormality has occurred on the rotating part (12).

The abnormality determiner (52) may be configured to determine that the abnormality has occurred when a predetermined number of events that the difference (ΔS) exceeds the threshold (TH) at the same phase in one revolution of the rotating part (12) have been detected and output the abnormality signal (Se). Thereby, it is possible to prevent occurrence of erroneous decision on an abnormality.

The rotating part (12) may include a second detected portion (20b) used for detecting the phase in one revolution of the rotating part (12). The rotation angle detecting device (10) may further include: a phase detector (34) arranged to oppose the second detected portion (20b) and configured to detect change of the physical quantity caused by rotation of the rotating part (12), in a third detection field (DF3) over the second detected portion (20b) and output a phase detection signal (Sz) of the rotating part (12). As a result, it is possible to grasp the phase in one revolution of the rotating part (12), that is, the angle of rotation (8) from the origin position of the rotating part (12).

The rotation angle detecting device (10) may further include: a rotation angle calculator (54) configured to calculate a rotation angle (θ) of the rotating shaft (Sf) based on the first detection signal (Sa) and the second detection signal (Sb). The rotation angle calculator (54) may be configured to calculate the rotation angle (θ) of the rotating shaft (Sf) without using the first detection signal (Sa) when the abnormality determiner (52) determines that an abnormality has occurred. As a result, it is possible to prevent degradation in detection accuracy (calculation accuracy) of the rotation angle (θ) of the rotating part (12) even if a foreign material (EX) or scratch is present on the rotating part (12).

The present invention is not limited to the embodiments described above, and it goes without saying that the embodiments can be freely modified within a range that does not deviate from the essence and gist of the present invention as set forth in the appended claims.

What is claimed is:
1. A rotation angle detecting device for detecting a rotation angle of a rotating shaft, comprising:

a magnetic rotor rotating integrally with the rotating shaft and including a detected portion used for detecting the rotation angle;

a first detector arranged to oppose the detected portion and configured to detect change of a magnetic flux density caused by rotation of the magnetic rotor in a first detection field over the detected portion and output a first detection signal representing the rotation angle of the magnetic rotor; and a second detector arranged to oppose the detected portion and configured to detect change of the magnetic flux density caused by rotation of the magnetic rotor in a second detection field located over the detected portion at a position different from the first detection field with respect to the rotating direction of the magnetic rotor and output a second detection signal that is out of phase with the first detection signal but represents the rotation angle of the magnetic rotor, wherein the second detection field is shorter than the first detection field with respect to a direction perpendicular to the rotating direction of the magnetic rotor.

2. The rotation angle detecting device according to claim 1, wherein the second detection field overlaps the first detection field with respect to the direction perpendicular to the rotating direction of the magnetic rotor.

3. The rotation angle detecting device according to claim 1, wherein the second detection field is located in a center of the detected portion with respect to the direction perpendicular to the rotating direction of the magnetic rotor.

4. The rotation angle detecting device according to claim 1, further comprising a plurality of the second detectors, wherein the second detection fields of the plurality of the second detectors are shifted so as not to overlap with one another with respect to the direction perpendicular to the rotating direction of the magnetic rotor.

5. The rotation angle detecting device according to claim 1, further comprising:

a signal comparator configured to compare the amplitude of the first detection signal with that of the second detection signal and output a difference therebetween; and an abnormality determiner configured to determine that an abnormality has occurred when the difference exceeds a threshold and output an abnormality signal.

6. The rotation angle detecting device according to claim 5, wherein the abnormality determiner is configured to determine that the abnormality has occurred when a predetermined number of events that the difference exceeds the threshold at a same phase in one revolution of the magnetic rotor have been detected, and output the abnormality signal.

7. The rotation angle detecting device according to claim 6, wherein the magnetic rotor includes a second detected portion used for detecting the phase in one revolution of the magnetic rotor, the rotation angle detecting device further comprises a phase detector arranged to oppose the second detected portion and configured to detect change of the magnetic flux density caused by rotation of the magnetic rotor in a third detection field over the second detected portion and output a phase detection signal of the magnetic rotor.

8. The rotation angle detecting device according to claim 5, further comprising a rotation angle calculator configured to calculate a rotation angle of the rotating shaft based on the first detection signal and the second detection signal, wherein the rotation angle calculator is configured to calculate the rotation angle of the rotating shaft without using the first detection signal when the abnormality determiner determines that an abnormality has occurred.

\* \* \* \* \*